(12) United States Patent
Fontana, Jr. et al.

(10) Patent No.: US 7,821,822 B2
(45) Date of Patent: Oct. 26, 2010

(54) READ/WRITE ELEMENTS FOR A THREE-DIMENSIONAL MAGNETIC MEMORY

(75) Inventors: Robert E. Fontana, Jr., San Jose, CA (US); Jordan A. Katine, Mountain View, CA (US); Ching Hwa Tsang, Sunnyvale, CA (US); Barry Stipe, San Jose, CA (US); Bruce D. Terris, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 108 days.

(21) Appl. No.: 12/191,956

(22) Filed: Aug. 14, 2008

(65) Prior Publication Data
US 2010/0039849 A1 Feb. 18, 2010

(51) Int. Cl.
*G11C 11/15* (2006.01)
(52) U.S. Cl. .................. 365/173; 365/130; 365/157; 365/158; 365/171
(58) Field of Classification Search .................. 365/130, 365/171, 157, 158, 97, 66, 173
See application file for complete search history.

(56) References Cited

U.S. PATENT DOCUMENTS 3,696,348 A * 10/1972 Kobayashi .................. 365/196
3,878,542 A * 4/1975 Myer ............................ 365/2

\* cited by examiner

*Primary Examiner*—Thong Q Le
(74) *Attorney, Agent, or Firm*—Duft Bornsen & Fishman, LLP

(57) ABSTRACT

Read/write elements for three-dimensional magnetic memories are disclosed. One embodiment describes an array of integrated read/write elements. The array includes read conductors formed proximate to one of the layers (i.e., storage stacks) of the three-dimensional magnetic memory. The array also includes flux caps formed proximate to the read conductors, and read sensors formed proximate to the flux caps. The array also includes a magnetic pole having a first end contacting the read sensor and a second end opposite the first end. First write conductors are fabricated between the magnetic poles, and second write conductors are also fabricated between the magnetic poles orthogonal to the first write conductors. The first write conductors and the second write conductors form current loops around the magnetic poles.

24 Claims, 7 Drawing Sheets

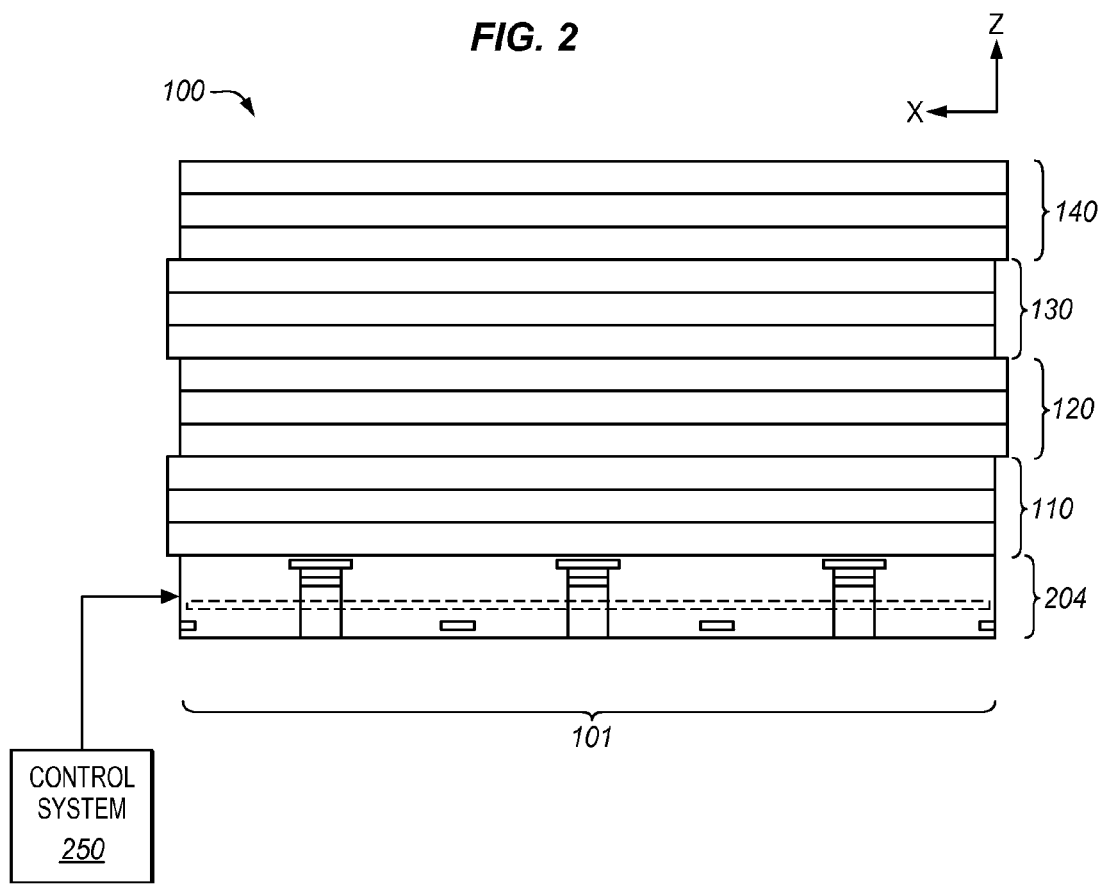
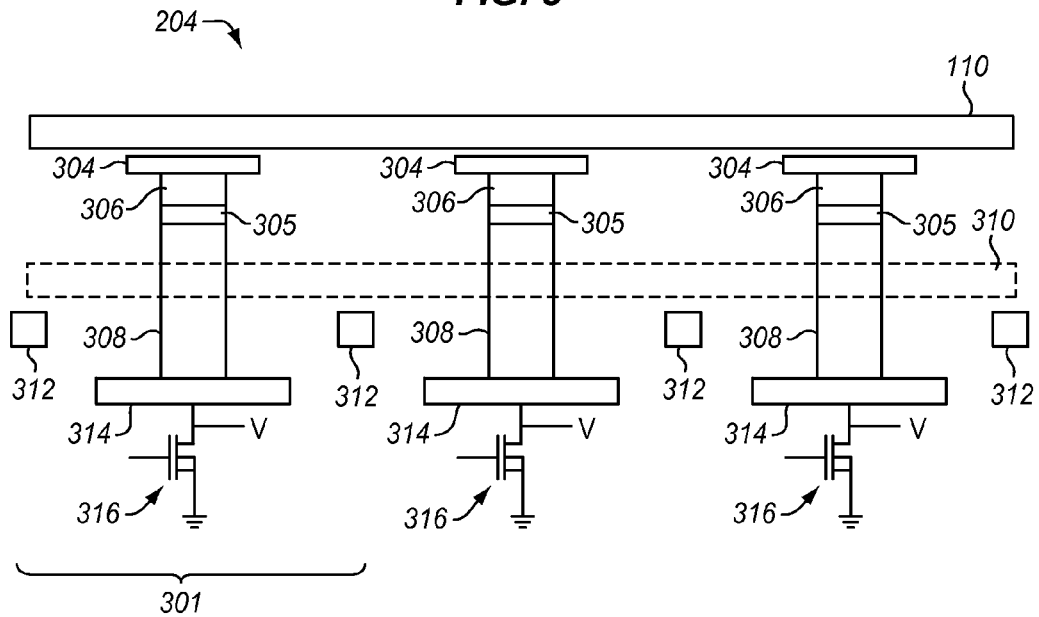

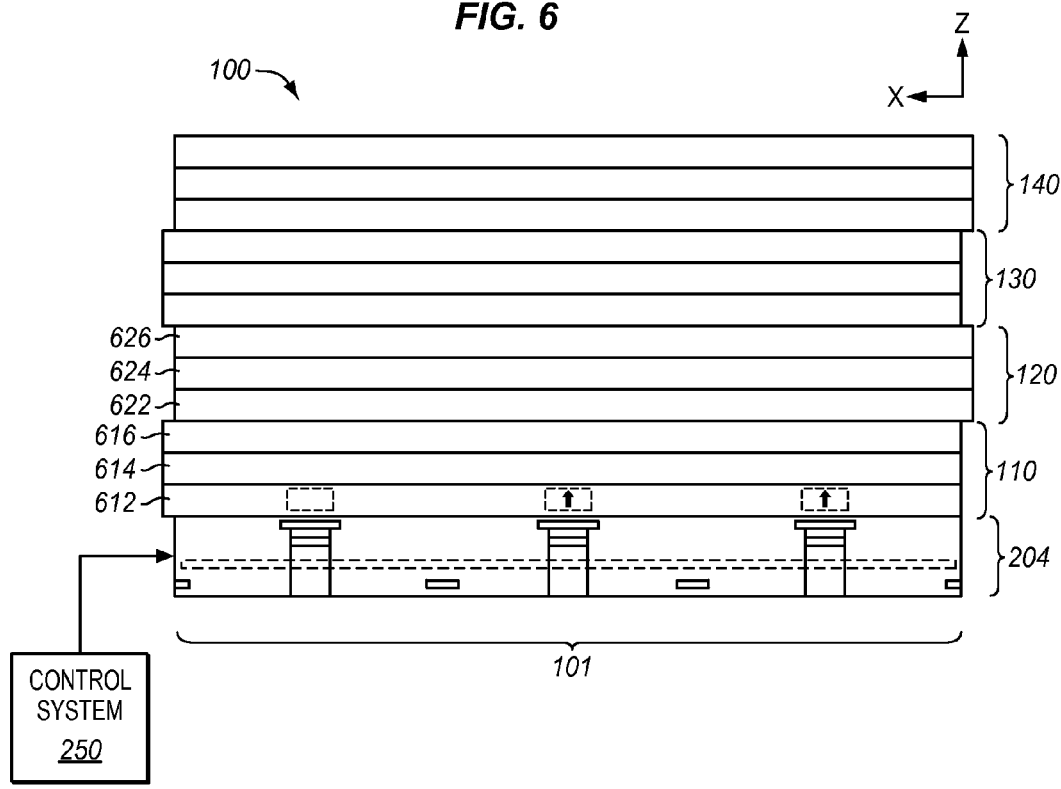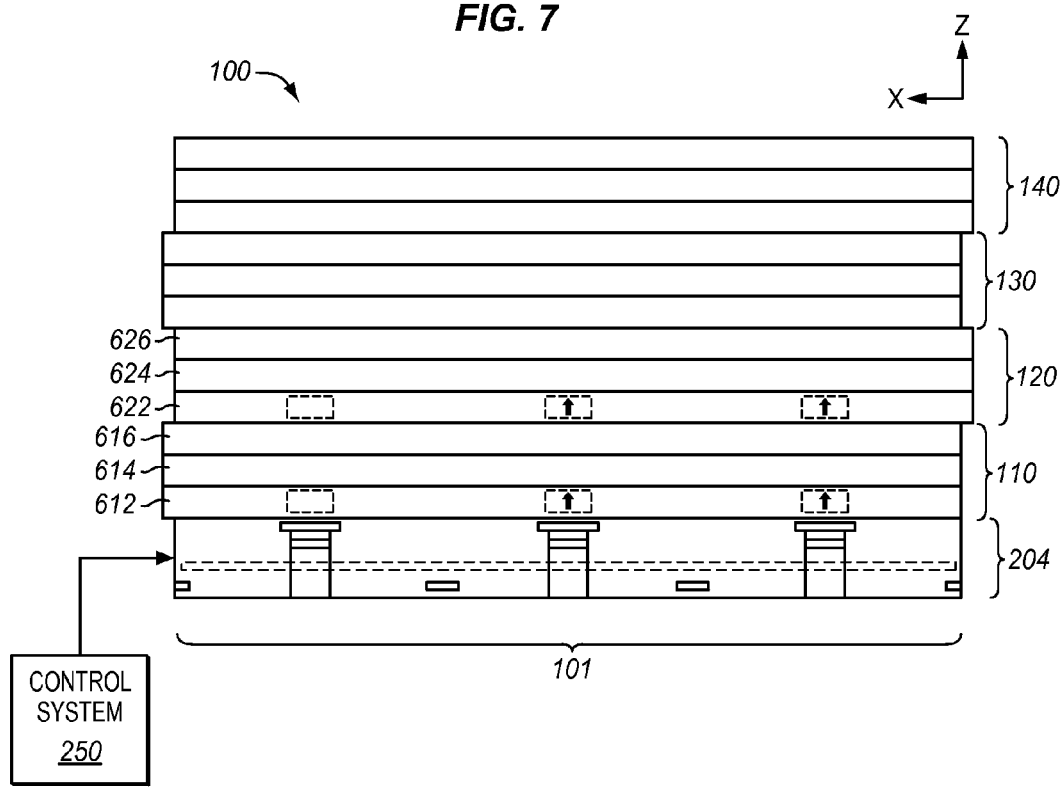

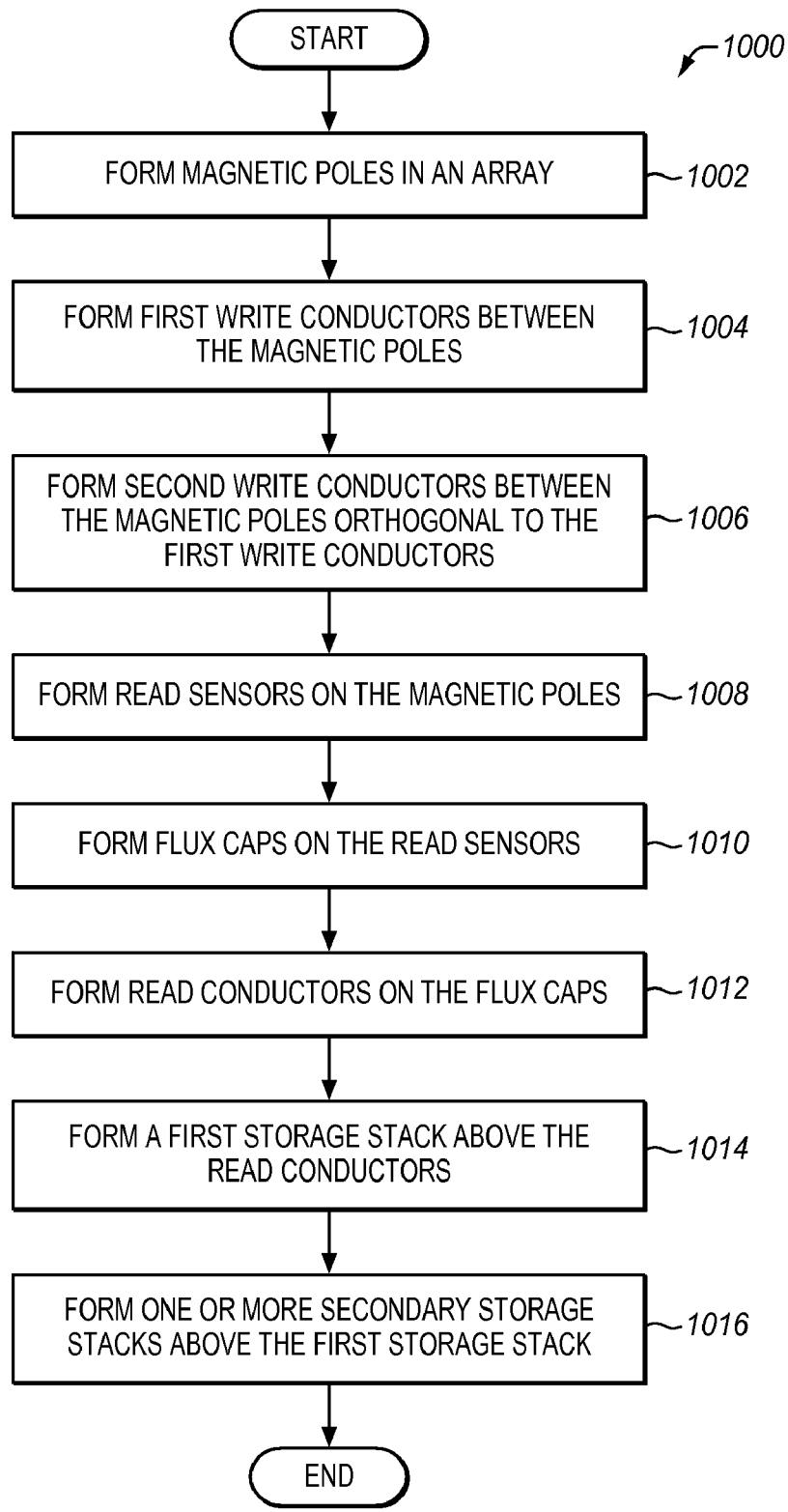

READ/WRITE ELEMENTS FOR A THREE-DIMENSIONAL MAGNETIC MEMORY

RELATED APPLICATIONS

This patent application relates to a U.S. patent application having the Ser. No. 11/615,618 that was filed on Dec. 22, 2006, which is incorporated herein by reference.

BACKGROUND OF THE INVENTION

1. Field of the Invention

The invention is related to the field of solid-state memories and, in particular, to a magnetic memory comprised of a three-dimensional stack of layers. More particularly, embodiments of the invention describe read/write elements for the three-dimensional magnetic memory.

2. Statement of the Problem

Solid-state memory is a nonvolatile storage medium that uses no moving parts. Some examples of solid-state memory are flash memory and MRAM (magnetoresistive random access memory). Solid-state memories provide advantages over conventional disk drives in that data transfers to and from solid-state memories take place at a much higher speed than is possible with electromechanical disk drives. Solid-state memories may also have a longer operating life and may be more durable due to the lack of moving parts.

Solid state memories are typically fabricated as a two-dimensional array of memory cells, also referred to as cross-point memory arrays. The memory cells may be formed from Magnetic Tunnel Junction (MTJ) devices or other types of semiconductor devices. To form the cross-point memory array, the array of memory cells is sandwiched between bit lines (i.e., conductors) on one side, and word lines on the other side which are situated orthogonal to the bit lines. To write to a memory cell, current is passed down the bit line and the word line which contact the memory cell. The current on the bit line and the word line are able to switch the state of the memory cell from a logical "1" to a logical "0" or vice versa. To read from the memory cell, current over the word line and/or the bit line are sensed to determine the present state of the memory cell.

One problem with traditional solid-state memories is that storage capacity is much less than can be achieved with electromechanical disk drives. For instance, a common flash memory may store up to approximately 1 gigabyte (GB), whereas a common hard drive may store up to 100 GB or more. Also, the cost per megabyte is higher for solid-state memories than for electromechanical disk drives. Thus, it would be desirable to fabricate or develop solid-state memories that have larger storage capacities.

SUMMARY OF THE SOLUTION

Embodiments of the invention solve the above and other related problems with a three-dimensional solid-state magnetic memory. The three-dimensional solid-state magnetic memory is able to store more data than a typical solid-state magnetic memory that stores data in only two dimensions. The embodiments provided herein more particularly focus on the read/write elements that are used in a three-dimensional solid-state magnetic memory.

One embodiment of the invention is an array of integrated read/write elements for a three-dimensional magnetic memory. The array includes read conductors formed proximate to one of the layers (i.e., storage stacks) of the three-dimensional magnetic memory. The array also includes flux caps formed proximate to the read conductors, and read sensors formed proximate to the flux caps. The array also includes a magnetic pole having a first end contacting the read sensor and a second end opposite the first end. First write conductors are fabricated between the magnetic poles, and second write conductors are also fabricated between the magnetic poles orthogonal to the first write conductors. The first write conductors and the second write conductors form current loops around the magnetic poles. This array of integrated read/write elements allows for magnetic domains to be written into a layer of the three-dimensional magnetic memory representing a page of bits. This array also allows for the magnetic domains to be later read from the layer of the three-dimensional magnetic memory.

Another embodiment of the invention comprises a method of fabricating a magnetic memory. The method includes forming a plurality of magnetic poles in an array. The method further includes forming a plurality of first write conductors that are aligned in parallel and fabricated between the magnetic poles. The method further includes forming a plurality of second write conductors that are aligned in parallel and fabricated between the magnetic poles orthogonal to the first write conductors. The method further includes forming read sensors on the magnetic poles, forming flux caps on the read sensors, and forming read conductors on the flux caps. A first storage stack may then be formed above the read conductors, and one or more secondary storage stacks may be formed above the first storage stack.

The invention may include other exemplary embodiments described below.

DESCRIPTION OF THE DRAWINGS

The same reference number represents the same element or same type of element on all drawings.

FIG. 2 is a cross-sectional view of a magnetic memory in an exemplary embodiment of the invention.

FIG. 3 is a cross-sectional view of a read/write structure in an exemplary embodiment of the invention.

FIG. 6 illustrates a magnetic memory with bits written into a first storage stack in an exemplary embodiment of the invention.

FIG. 7 illustrates a magnetic memory with the bits copied from a first storage stack to a second storage stack in an exemplary embodiment of the invention.

FIG. 10 is a flow chart illustrating a method of fabricating a magnetic memory in an exemplary embodiment of the invention.

DETAILED DESCRIPTION OF THE INVENTION

FIGS. 1-10 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
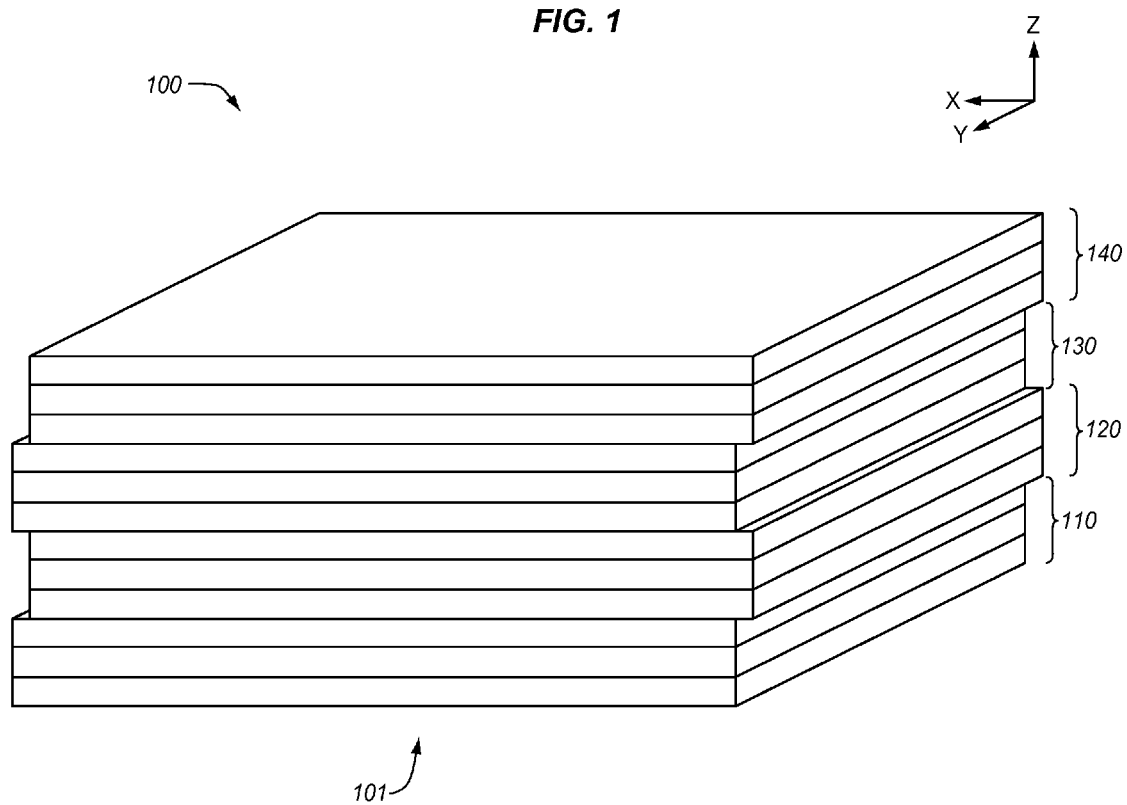
FIG. 1 is an isometric view of a magnetic memory in an exemplary embodiment of the invention.

FIG. 1 is an isometric view of magnetic memory 100 in an exemplary embodiment of the invention. The view in FIG. 1 only shows a portion of magnetic memory 100, as an actual magnetic memory may extend further in the X, Y, or Z direction. Magnetic memory 100 includes a main column 101 of layers comprising a first storage stack 110, a second storage stack 120, a third storage stack 130, and a fourth storage stack 140. Each individual storage stack 110-140 is operable to store bits of data either persistently or temporarily in one or more of its layers. Although one main column 101 of layers is shown in FIG. 1, magnetic memory 100 may include a plurality of main columns. For instance, if the main column 101 shown in FIG. 1 provides 4 Mbits of storage (such as 2K in the X-direction and 2K in the Y direction), then magnetic memory 100 may include a plurality of main columns 101 as shown in FIG. 1 to provide 16 Mbits, 32 Mbits, 64 Mbits, etc.

Within main column 101, storage stack 110 is proximate to storage stack 120. Storage stack 120 is proximate to storage stack 130. Storage stack 130 is proximate to storage stack 140. Being proximate means that one stack is adjacent to or adjoining another stack. There may be more or less storage stacks in magnetic memory 100 that are not illustrated in this embodiment. For instance, magnetic memory 100 may include a fifth storage stack, a sixth storage stack, etc.

Storage stacks 110-140 are illustrated as multi-layer stacks. Each multi-layer stack may include any subset of layers operable to store bits of data. For example, storage stack 110 may include a data storage layer, an insulating layer, and a heating layer. The data storage layer is operable to store bits of data in the form of magnetic domains. The insulating layer is operable to insulate the data storage layer from other data storage layers when it is heated. The heating layer is operable to heat the data storage layer. The storage stacks may include more or less layers than described above.

Storage stacks 110-140 are aligned in the Z-direction to form substantially parallel planes, as is evident in FIG. 1. For example, storage stack 110 defines a first plane in the X-Y direction. Storage stack 120 defines a second plane in the X-Y direction that is substantially parallel to the first plane. Storage stack 130 defines a third plane in the X-Y direction, and storage stack 140 defines a fourth plane in the X-Y direction.

FIG. 2 is a cross-sectional view of magnetic memory 100 in an exemplary embodiment of the invention. As illustrated in FIG. 2, magnetic memory 100 includes a read/write structure 204 that is fabricated proximate to storage stack 110. Although FIG. 2 is shown in two-dimensions, those skilled in the art will appreciate that the read/write structure 204 extends in the X-Y direction in order to write a page of bits into storage stack 110 and to read a page of bits from storage stack 110.

Magnetic memory 100 also includes a control system 250 that may be comprised of a plurality of transistors and/or other processing elements. Control system 250 is operable to control how data is written to the storage stacks 110-140, how data is moved between the storage stacks 110-140 in the Z direction, and how data is read from the storage stacks 110-140.

FIG. 3 is a cross-sectional view of read/write structure 204 in an exemplary embodiment of the invention. Read/write structure 204 comprises an array of individual read/write elements 301 in the X-Y direction. The read/write elements 301 are spaced apart in the array according to a desired bit density in the storage stacks 110-140. The read portion of the read/write elements 301 includes a read conductor 304, a flux cap 306, and a read sensor 305. Read conductors 304 are fabricated proximate to a layer of storage stack 110 in this embodiment. The read conductors 304 are oriented parallel to one another, and connect to control system 250 so that control system 250 may selectively apply a voltage to one or more of the read conductors 304. Flux cap 306 is comprised of a magnetic material, and connects a read conductor 304 to a read sensor 305 in an individual read/write element 301. Read sensor 305 comprises any element operable to sense magnetic fields from magnetic domains that represent bits stored in storage stack 110. For example, read sensor 305 may comprise a spin valve sensor, a tunnel valve sensor, or another type of magnetoresistance (MR) sensor. The MR sensor may be comprised of free layers and pinned layers having longitudinal or perpendicular anisotropy. Typical materials having perpendicular anisotropy include Co/Ni, Co/Pt, or Co/Pd. If read sensor 305 is an MR sensor, then magnetic domains stored in storage stack 110 affect the resistance of the sensor, which may be detected by passing a sense current through the sensor.

The write portion of the read/write elements 301 include a magnetic pole 308, first write conductors 310 fabricated between the magnetic poles 308, and second write conductors 312 fabricated between the magnetic poles 308 orthogonal to the first write conductors 310. The first write conductors 310 in FIG. 3 are parallel to the page and are illustrated as dotted lines as these conductors 310 are in between the magnetic poles 308. The second write conductors 312 in FIG. 3 are perpendicular to the page. The first write conductors 310 and the second write conductors 312 form current loops surrounding the magnetic poles 308. The write conductors 310 and 312 connect to control system 250 so that control system 250 may selectively inject a current through the appropriate write conductors 310 and 312. The current in a current loop generates a magnetic field in the write pole 308 which is used to imprint a magnetic domain into storage stack 110.

Magnetic poles 308 also connect to magnetic pedestal 314, which is in turn connected to transistors 316. Transistors 316 are used in read operations, and are also connected to control system 250. For example, the transistors may comprise MOSFETs having sources that connect to magnetic pedestal 314. Although transistors are illustrated in FIG. 3, those skilled in the art will appreciate that other types of switching elements may be used in other embodiments.

Figure 4:
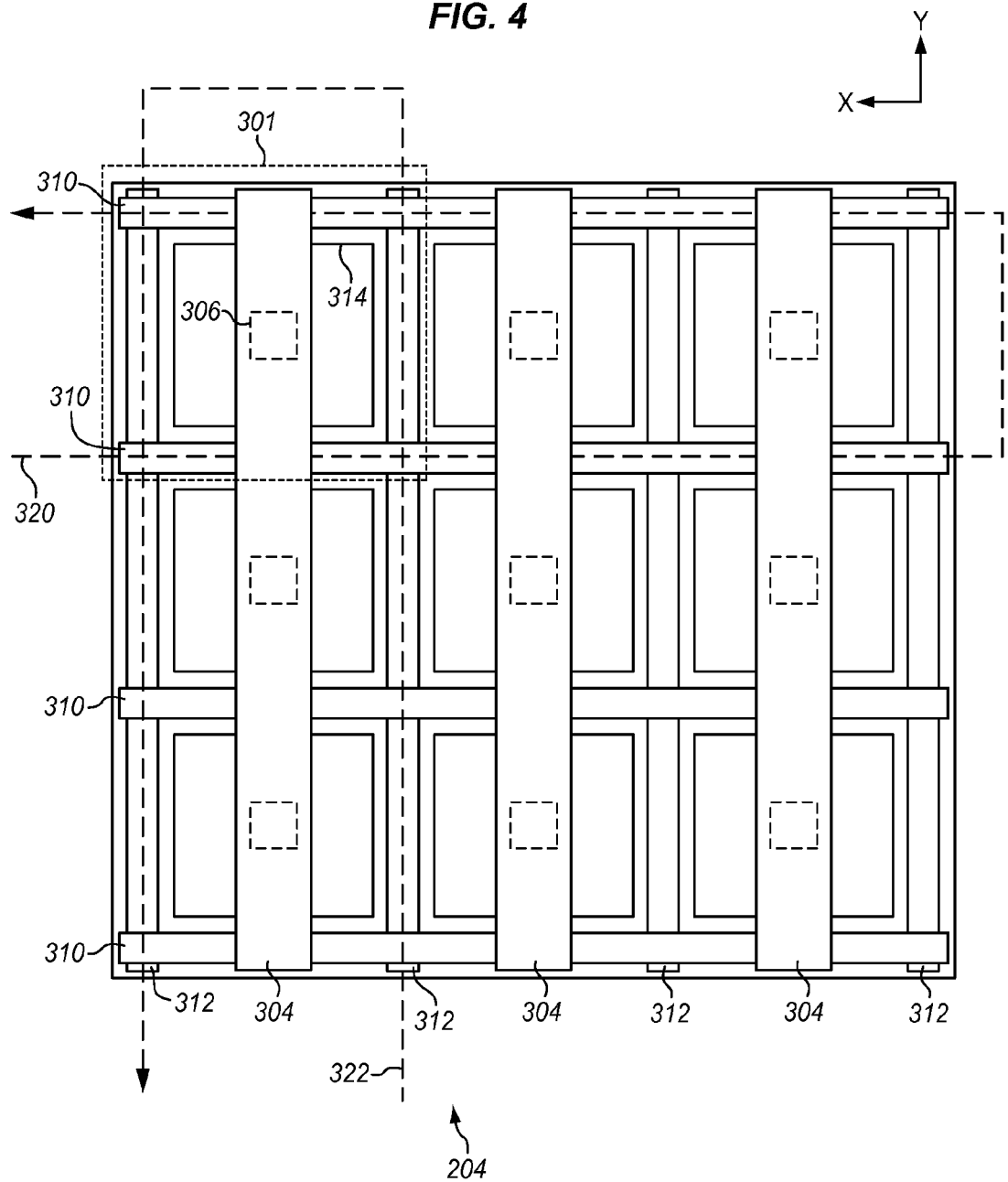
FIG. 4 is a top view of a read/write structure in an exemplary embodiment of the invention.

FIG. 4 is a top view of read/write structure 204 in an exemplary embodiment of the invention. As is illustrated in FIG. 4, read/write structure 204 is an array of read/write elements 301. FIG. 4 only illustrates a portion of the array, as the array is actually much larger so that the magnetic memory 100 can store kilo-bytes or mega-bytes of data.

From the view in FIG. 4, read conductors 304 are aligned parallel to one another, and are spaced apart a desired amount. Beneath read conductors 304 in each individual read/write element 301 is the flux cap 306 (which is illustrated in dotted lines). The read sensor 305 and the magnetic pole 308 are also underneath flux cap 306 and above magnetic pedestal 314, but not visible in FIG. 4.

The first write conductors 310 are aligned parallel to one another, and are spaced apart a desired amount between the magnetic poles 308. The second write conductors 312 are also aligned parallel to one another, and are spaced apart a desired amount between the magnetic poles 308. The second write conductors 312 are orthogonal to the first write conductors 310 so that the write conductors 310 and 312 form current loops around the magnetic poles 308.

A layer of storage stack 110 (see also FIG. 2) sits on top of the read/write structure 204 as shown in FIG. 4. The location of each individual read/write element 301 represents the location where a bit of data will be stored in storage stack 110.

To write to storage stack 110, control system 250 (see also FIG. 2) selectively injects current through pairs of the first write conductors 310 and through pairs of the second write conductors 312. When current is injected through pairs of write conductors 310 and 312, a current loop is generated around one or more of the magnetic poles 308. The current loop generates a magnetic field in the magnetic pole 308. For example, if control system 250 injects a current 320 that passes through the top two pair of write conductors 310 in FIG. 4, and also injects a current 322 that passes through the two left-most pair of write conductors 312, a current loop is formed around the magnetic pole in the top-left read/write element 301. This current loop may thus generate a magnetic field in the magnetic pole 308 that is pointing out of the page in FIG. 4.

The magnetic field generated in the magnetic pole 308 creates or imprints a magnetic domain in storage stack 110. A magnetic domain comprises a region of magnetization surrounded by regions of a different magnetization (or background magnetization). The magnetic domains imprinted in storage stack 110 represent bits (or page of bits) of data that are written into storage stack 110. Magnetic domains may also be referred to herein as regions of magnetization or magnetic imprints. Control system 250 may heat storage stack 110 to assist in creating the magnetic domains in storage stack 110. Heating the storage stack 110 to just below its Curie temperature reduces the coercivity (Hc) and allows the magnetization of this stack to be more easily influenced by the magnetic fields from read/write elements 301.

Figure 5:
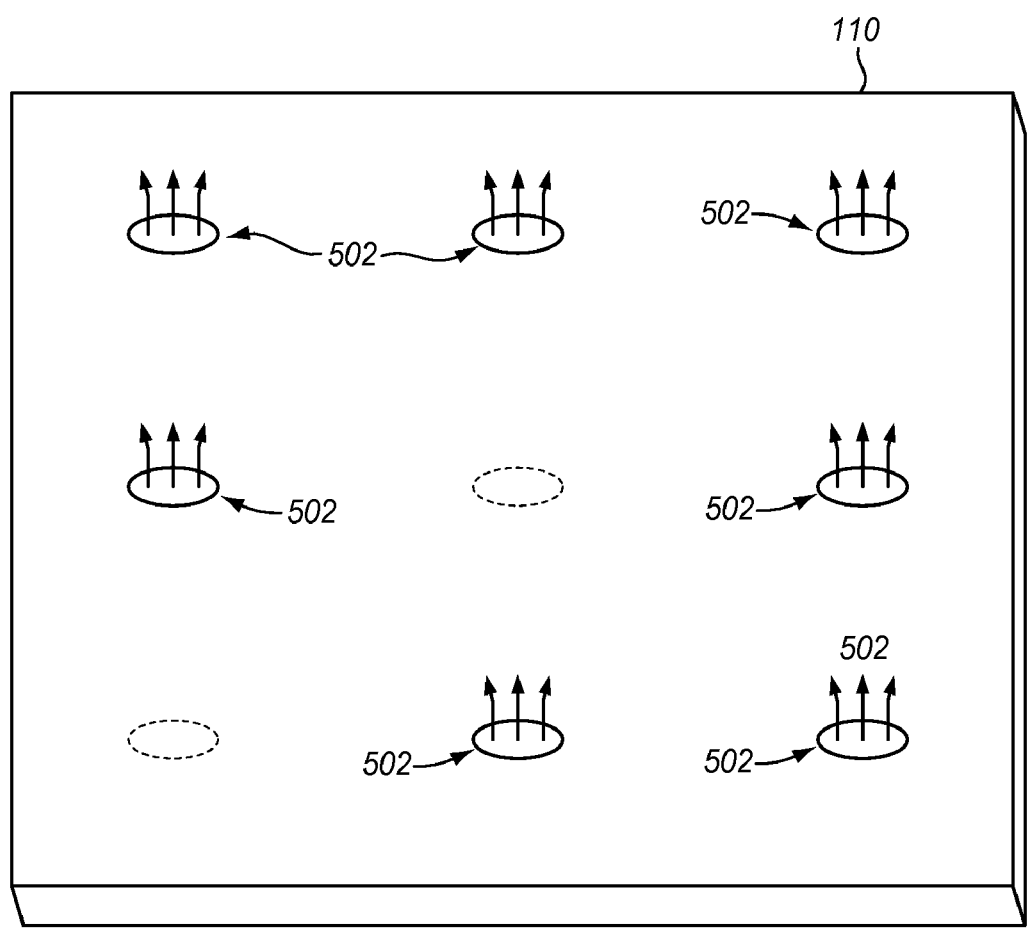
FIG. 5 is an isometric view of a storage stack illustrating bits written to the storage stack in an exemplary embodiment of the invention.

FIG. 5 is an isometric view of storage stack 110 illustrating bits written to storage stack 110 in an exemplary embodiment of the invention. Storage stack 110 has a background magnetization, such as a magnetization perpendicular to the plane pointing downward in FIG. 5. Bits are written to storage stack 110 in the form of magnetic domains 502. The magnetic domains 502 are formed by changing the magnetization locally to a polarity opposite the primary magnetization of storage stack 110. The magnetization of magnetic domains 502 are illustrated by arrows in FIG. 5. The existence of a magnetic domain 502 magnetized opposite to the background magnetization indicates one binary value of a bit, such as a "1". The absence of an oppositely-magnetized domain 502 in a particular region in storage stack 110 indicates another binary value of a bit, such as a "0". The absence of a magnetic domain 502 in FIG. 5 is illustrated as a dotted circle.

To read from storage stack 110, control system 250 selectively applies a voltage to read conductors 304 (see FIGS. 2-3). Control system 250 also selectively applies a voltage to the gate of transistors 316 in order to switch the transistors on. The voltage applied to read conductor 304 creates a sense current that passes through flux cap 306, read sensor 305, magnetic pole 308, and through the transistor 316. The magnetic domains in storage stack 110 will affect the magnetization of read sensor 305, which in turn affects the resistance of the read sensor 305. By passing the sense current through read sensor 305, the resistance of the read sensor 305 may be measured based on the transistor current as measured by a sense amplifier circuit (not shown). A first resistance R1 of read sensor 305 indicates the existence of a magnetic domain in storage stack 110, and a bit having a value of "1". A second resistance R2 of read sensor 305 indicates the absence of a magnetic domain in storage stack 110, and a bit having a value of "0". As known in the art, the resistances and associated currents should be compatible with CMOS circuitry. For example, a tunnel valve can be made to have first and second resistances in the 10 kΩ to 1 MΩ range. For a 1 volt applied voltage, the current will be in the 1 uA to 100 uA range.

Magnetic memory 100 comprises a page memory structure where one storage stack 110-140 is fabricated on top of another storage stack in the Z-direction. Thus, bits written into one of the storage stacks may be moved or copied between the storage stacks 110-140 in the Z-direction. FIG. 6 illustrates magnetic memory 100 with bits written into storage stack 110. As previously mentioned, storage stacks 110-140 may include a data storage layer, an insulating layer, and a heating layer. For example, storage stack 110 may include data storage layer 612, heating layer 614, and insulating layer 616. Storage stack 120 may include data storage layer 622, heating layer 624, and insulating layer 626. The other storage stacks 130-140 may include similar layers.

In FIG. 6, a page of bits has been written into storage stack 110 (i.e., into the data storage layer 612 of storage stack 110). To represent the page of bits, magnetic domains has been imprinted into storage stack 110 by the rightmost read/write element and the middle read/write element. The magnetic domains are indicated by a single arrow pointing upward in a dotted box representing a region proximate to the rightmost read/write element and a region proximate to the middle read/write element. No magnetic domain has been imprinted into storage stack 110 proximate to the leftmost read/write element. The absence of a magnetic domain is indicated by a dotted box representing a region proximate to the leftmost read/write element that does not include an arrow.

With the bits written into storage stack 110 in FIG. 6, control system 250 may transfer the bits up main column 101 as follows. Control system 250 heats one or more layers in storage stack 120 so that magnetic fields from the magnetic domains in storage stack 110 imprint the magnetic domains in storage stack 120. By imprinting the magnetic domains from storage stack 110 to storage stack 120, the bits stored in storage stack 110 are copied to storage stack 120 in the Z direction (upward in FIG. 6). Although heat is used in this embodiment to imprint the magnetic domains from storage stack 110 to storage stack 120, other methods or means may be used to facilitate the transfer of the magnetic domains. FIG. 7 illustrates magnetic memory 100 with the bits copied from storage stack 110 to storage stack 120.

The magnetic domains may not be imprinted directly from storage stack 110 to storage stack 120. As previously stated, there may be an intermediate layer between storage stack 110 and storage stack 120 that facilitates the transfer. For instance, control system 250 may first copy the magnetic domains from storage stack 110 to the intermediate layer, and then copy the magnetic domains from the intermediate layer to storage stack 120. The intermediate layer(s) acts as a buffer to prevent other magnetic domains in other layers (such as magnetic domains for other bit patterns) from interfering with the transfer of the magnetic domain from storage stack 110 to storage stack 120.

Figure 8:
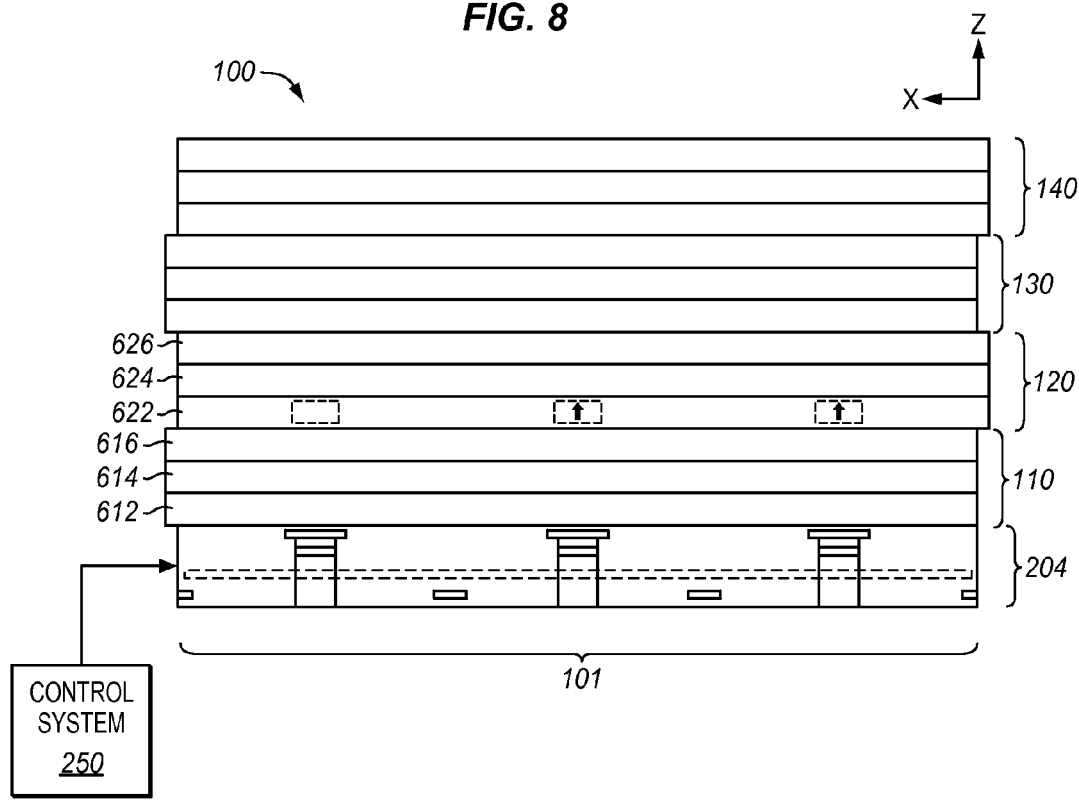
FIG. 8 illustrates a magnetic memory with the bits erased from a first storage stack in an exemplary embodiment of the invention.

With the bits written into storage stack 120 in FIG. 7, control system 250 may transfer the bits up main column 101. After copying bits from one storage stack to another, control system 250 may erase the bits from the sending storage stack. For instance, to erase bits from storage stack 110, control system 250 may heat storage stack 110 to or above its Curie temperature (Tc) to erase the magnetic domains and to return storage stack 110 to its primary or background magnetization after it is cooled. Control system 250 may heat and cool storage stack 110 in the presence of a bias field in order to return storage stack 110 to its primary or background magnetization. The bits are thus erased from storage stack 110. FIG. 8 illustrates magnetic memory 100 with the bits erased from storage stack 110.

Figure 9:
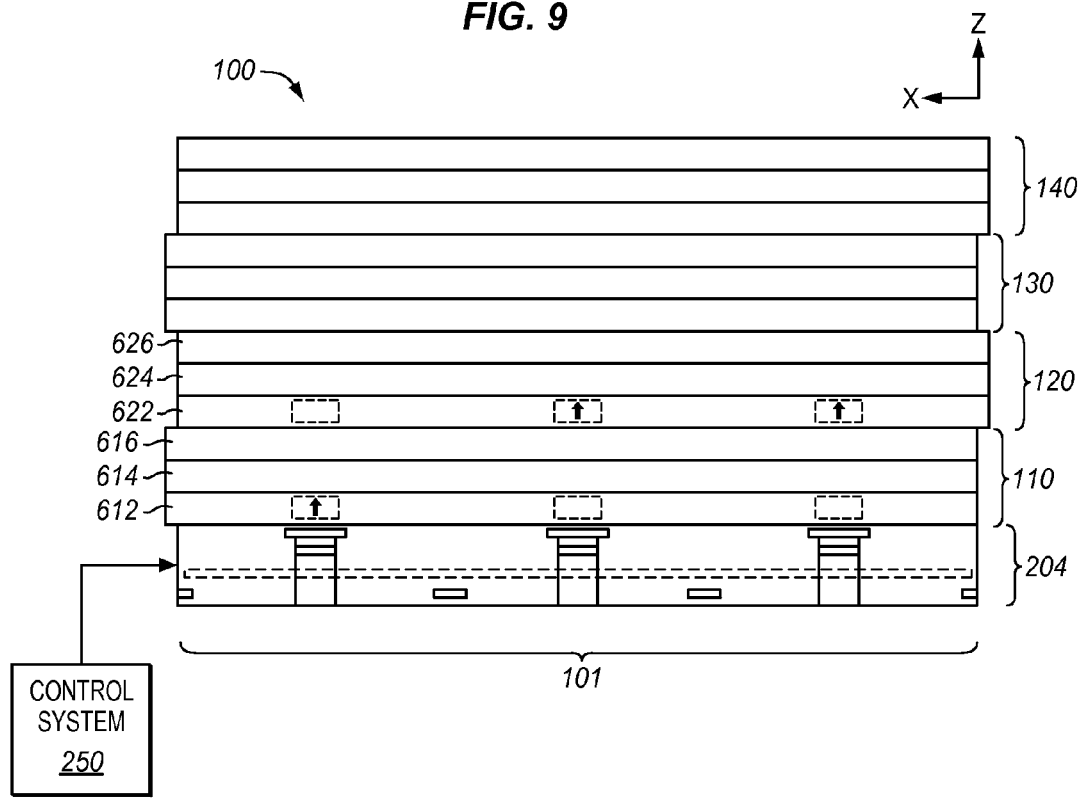
FIG. 9 illustrates a magnetic memory with a first page of bits written into a first storage stack and a second page of bits written into a second storage stack in an exemplary embodiment of the invention.

With the bits stored in storage stack 120, control system 250 may cause read/write elements 301 to write another bit pattern into storage stack 110. Thus, multiple pages of bits (or multiple bit patterns) may be written into the different storage stacks 110-140. FIG. 9 illustrates magnetic memory 100 with a first page of bits written into storage stack 120 and a second page of bits written into storage stack 110. FIG. 9 illustrates how the page memory structure of magnetic memory 100 can simultaneously store multiple pages of bits. The page of bits stored in storage stacks 110 and 120 could be moved further up main column 110 to storage layers 130 and 140. Then two more different pages of bits could be written into storage stacks 110 and 120 by read/write elements 301.

The page of bits that has been written into magnetic memory 100 will need to be read at some point. To read the bits in magnetic memory 100, the bits need to be transferred down main column 101 to storage stack 110 because storage stack 110 is proximate to read/write elements 301. Assume that a page of bits to be read is presently being stored in storage stack 120 as illustrated in FIG. 8. If other bit patterns are stored in storage stack 110 (such as in FIG. 9), these bits patterns are read and temporarily offloaded to an overflow storage system (not shown).

To move the page of bits down main column 101, control system 250 heats storage stack 110 so that magnetic fields from the magnetic domains in storage stack 120 imprint the magnetic domains in storage stack 110. By imprinting the magnetic domains from storage stack 120 to storage stack 110, the bits stored in storage stack 120 are copied to storage stack 110 in the Z direction as is illustrated in FIG. 7.

After copying the page of bits from storage stack 120 to storage stack 110, control system 250 may erase the bits from the sending storage stack. For instance, to erase bits from storage stack 120, control system 250 may heat storage stack 120 to or above its Curie temperature (Tc) to erase the magnetic domains and to return storage stack 120 to its primary or background magnetization after it is cooled. Control system 250 may heat and cool storage stack 120 in the presence of a bias field in order to return storage stack 120 to its primary or background magnetization. The bits are thus erased from storage stack 120 as is illustrated in FIG. 6.

With the bits transferred to storage stack 110 which is proximate to read/write elements 301, the bits are in a position to be read by read/write elements 301. Control system 250 selectively applies voltages to selected read conductors 304 (see also FIGS. 3-4). The voltages applied to the selected read conductors 304 generates a sense current through flux cap 306, read sensor 305, and magnetic pole 308 of the read/write elements 301 connected to the selected read conductors 304 (assuming that transistor 316 is switched to an "on" state). Concurrently, any magnetic domains that are written into storage stack 110 will affect the resistance of the read sensor 305. For example, if read sensors 305 are tunnel valves, then the resistance of the tunnel valve will depend on the direction and magnitude of the field emanating from the magnetic domains in storage stack 110. Upwardly-pointing magnetic fields from a magnetic domain will result in one value of resistance, while a downwardly-pointing magnetic field (such as for the background magnetization) will result in a second resistance. An isolated magnetic domain thus results in one resistance, while the background magnetization or no isolated domain, results in a second resistance.

Control system 250 then measures the resistances of the read sensors 305 to detect the presence of magnetic domains written into storage stack 110. Control system 250 measures the resistance by measuring the current passing through the transistors 316. Based on the resistance measurement of each of the read sensors 305, the page of bits may be read from storage stack 110.

FIG. 10 is a flow chart illustrating a method 1000 of fabricating a magnetic memory in an exemplary embodiment of the invention. Method 1000 may be used to fabricate magnetic memory 100 illustrated in the previous figures. Step 1002 comprises forming a plurality of magnetic poles 308 in an array. The magnetic poles 308 are formed from an electrically conductive, magnetic material, such as NiFe. The locations of the magnetic poles 308 correspond with the locations where magnetic domains will be written into a storage stack that is fabricated proximate to the magnetic poles. Step 1004 comprises forming a plurality of first write conductors 312 that are aligned in parallel, and are fabricated between the magnetic poles 308. Step 1006 comprises forming a plurality of second write conductors 310 that are aligned in parallel, and are fabricated between the magnetic poles 308 orthogonal to the first write conductors 312. The first write conductors 310 and the second write conductors 312 are formed from an electrically conductive material, such as Al or Cu. The first write conductors 310 and the second write conductors 312 are deposited in different layers so that they are not in contact. Even though they are not in contact, the first write conductors 310 and the second write conductors 312 form current loops surrounding the magnetic poles 308. Steps 1002-1006 are performed by repeated photolithographic processes of depositing material in layers, and removing a portion of the deposited material.

Step 1008 comprises forming read sensors 305 on the magnetic poles 308. The step 1008 of forming read sensors 305 may comprise multiple deposition steps. For example, if read sensor 305 comprises an MR sensor, then it is formed from multiple thin films of material. Thus, step 1008 may comprise multiple steps of depositing a layer of material, and removing unwanted portions to form the read sensors 305. If the read sensor 305 comprises a tunnel valve sensor, then step 1008 may include at least the steps of depositing a pinned layer, depositing a tunnel barrier layer, and depositing a free layer.

Step 1010 comprises forming flux caps 306 on read sensors 305. The flux caps 306 are formed from an electrically conductive, magnetic material, such as NiFe. Step 1012 comprises forming read conductors 304 on the flux caps 306 that are aligned in parallel. Read conductors 304 are formed from an electrically conductive material, such as Al or Cu.

Step 1014 comprises forming a first storage stack above the read conductors 304. The term "above" as used herein means "on" or "proximate to". The first storage stack includes a data storage layer comprised of magnetic material, such as TbFeCo or CoPt multi-layers, that is operable to store bits of data. Step 1016 comprises forming one or more secondary storage stacks above the first storage stack. Each of the secondary storage stacks includes a data storage layer comprised of magnetic material that is operable to store bits of data. The first storage stack and the secondary storage stacks form a page memory structure where pages of bits may be transferred between storage stacks as described above.

Although specific embodiments were described herein, the scope of the invention is not limited to those specific embodiments. The scope of the invention is defined by the following claims and any equivalents thereof.

We claim:

1. A magnetic memory, comprising:
   a plurality of storage stacks fabricated on top of one another to form a three-dimensional memory structure; and
   an array of read/write elements proximate to one of the storage stacks;
   wherein the array of read/write elements comprises:
      read conductors formed proximate to the one of the storage stacks;
      read sensors; and
      flux caps formed between the read sensors and the read conductors.

2. The magnetic memory of claim 1 wherein the read sensors comprise magnetoresistance (MR) sensors.

3. The magnetic memory of claim 2 wherein the MR sensors are formed from films having perpendicular anisotropy.

4. The magnetic memory of claim 1 wherein the array of read/write elements comprises:
   magnetic poles each having a first end contacting a read sensor and a second end opposite the first end;
   first write conductors fabricated between the magnetic poles; and
   second write conductors fabricated between the magnetic poles orthogonal to the first write conductors;
   wherein the first write conductors and the second write conductors form current loops around the magnetic poles.

5. The magnetic memory of claim 4 wherein the array of read/write elements further comprises:
   transistors having sources connected to the second end of the magnetic poles.

6. The magnetic memory of claim 5 further comprising:
   a control system operable to selectively inject current through pairs of the first write conductors and through pairs of the second write conductors to create magnetic fields in selected magnetic poles that write magnetic domains into the one storage stack.

7. The magnetic memory of claim 6 wherein:
   the control system is further operable to selectively apply voltages to selected read conductors, and to measure the resistances of the read sensors associated with the selected read conductors through the transistors in order to detect the existence of magnetic domains written into the one storage stack.

8. The magnetic memory of claim 1 wherein the plurality of storage stacks of the three-dimensional memory structure includes:
   a first storage stack defining a first plane; and
   at least one secondary storage stack defining a second plane that is parallel to the first plane.

9. An array of integrated read/write elements for a three-dimensional magnetic memory, the array comprising:
   read conductors formed proximate to one of the layers of the three-dimensional magnetic memory;
   flux caps formed proximate to the read conductors;
   read sensors formed proximate to the flux caps;
   magnetic poles each having a first end contacting a read sensor and a second end opposite the first end;
   first write conductors fabricated between the magnetic poles; and
   second write conductors fabricated between the magnetic poles orthogonal to the first write conductors.

10. The array of claim 9 wherein the read sensors comprise magnetoresistance (MR) sensors.

11. The array of claim 10 wherein the MR sensors are formed from films having perpendicular anisotropy.

12. The array of claim 10 further comprising:
    transistors having sources connected to the second end of the magnetic poles.

13. The array of claim 12 further comprising:
    a control system operable to selectively inject current through pairs of the first write conductors and through pairs of the second write conductors to create magnetic fields in selected magnetic poles that write magnetic domains into the one layer of the three-dimensional magnetic memory.

14. The array of claim 13 wherein:
    the control system is further operable to selectively apply voltages to selected read conductors, and to measure the resistances of the read sensors associated with the selected read conductors through the transistors in order to detect the existence of magnetic domains written into the one layer of the three-dimensional magnetic memory.

15. An array of read elements for a three-dimensional magnetic memory, the array comprising:
    read conductors formed proximate to one of a plurality of stacked layers for the three-dimensional magnetic memory, wherein the one of the stacked layers includes a plurality of magnetic domains representing a page of bits;
    flux caps formed proximate to the read conductors;
    read sensors formed proximate to the flux caps; and
    transistors having sources connected to the read sensors through a conductive material.

16. The array of claim 15 wherein the read sensors comprise magnetoresistance (MR) sensors.

17. The array of claim 16 wherein the MR sensors are formed from films having perpendicular anisotropy.

18. The array of claim 16 further comprising:
    a control system operable to selectively apply voltages to selected read conductors, and to measure the resistances of the read sensors associated with the selected read conductors through the transistors in order to detect the existence of magnetic domains in the one of the stacked layers and read the page of bits from the one of the stacked layers.

19. An array of write elements for a three-dimensional magnetic memory, the array comprising:
    magnetic poles having first ends proximate to one of a plurality of stacked layers for the three-dimensional magnetic memory and extending perpendicular to the one of the stacked layers to second ends;
    first write conductors fabricated between the magnetic poles; and
    second write conductors fabricated between the magnetic poles orthogonal to the first write conductors.

20. The array of claim 19 further comprising:
    a control system operable to selectively inject current through pairs of the first write conductors and through pairs of the second write conductors to create magnetic fields in selected magnetic poles that write magnetic domains into the one of the stacked layers.

21. A method of fabricating a magnetic memory, the method comprising:
    forming a plurality of magnetic poles in an array;
    forming a plurality of first write conductors that are aligned in parallel and are fabricated between the magnetic poles;

forming a plurality of second write conductors that are aligned in parallel and are fabricated between the magnetic poles orthogonal to the first write conductors;
forming read sensors on the magnetic poles;
forming flux caps on the read sensors; and
forming read conductors on the flux caps that are aligned in parallel.

22. The method of claim 21 further comprising:
forming a first storage stack above the read conductors.

23. The method of claim 21 further comprising:
forming one or more secondary storage stacks above the first storage stack.

24. The method of claim 21 wherein forming read sensors on the magnetic poles comprises:
depositing a pinned layer;
depositing a tunnel barrier layer; and
depositing a free layer.

* * * * *